US009841806B1

(12) United States Patent
Haywood

(10) Patent No.: US 9,841,806 B1
(45) Date of Patent: Dec. 12, 2017

(54) METHOD AND SYSTEM USING MEMORY CHANNEL LOAD SHARING

(71) Applicant: Rambus Inc., Sunnyvale, CA (US)

(72) Inventor: Chris Haywood, Thousand Oaks, CA (US)

(73) Assignee: Rambus Inc., Sunnyvale, CA (US)

( * ) Notice: Subject to any disclaimer, the term of this patent is extended or adjusted under 35 U.S.C. 154(b) by 131 days.

(21) Appl. No.: 14/706,886

(22) Filed: May 7, 2015

(51) Int. Cl.
*G06F 1/32* (2006.01)
*G11C 14/00* (2006.01)
*G11C 7/10* (2006.01)

(52) U.S. Cl.
CPC .......... *G06F 1/3275* (2013.01); *G11C 7/1072* (2013.01); *G11C 14/0009* (2013.01)

(58) Field of Classification Search
None
See application file for complete search history.

(56) References Cited

U.S. PATENT DOCUMENTS

2004/0201931 A1* 10/2004 Korcharz ............... H02J 1/10
361/18
2013/0141991 A1* 6/2013 Solvin ................. G11C 5/148
365/189.07

\* cited by examiner

*Primary Examiner* — Nitin Patel
*Assistant Examiner* — Joshua Neveln
(74) *Attorney, Agent, or Firm* — Lowenstein Sandler LLP

(57) ABSTRACT

A memory load sharing system and method therefor. This system can include a platform VRM (Voltage Regulator Module) coupled to a memory channel with the platform VRM having a platform voltage input. One or more first memory modules can coupled to the platform VRM through the memory channel. Each of the first memory modules includes one or more plane connectors and a module connector, as well as a memory module VRM coupled to a module load sharing diode that is coupled to the one or more plane connectors of that first memory module. The platform VRM is coupled to a first platform load sharing diode that is coupled the plane connectors of each of the first memory modules. This platform is configured to support load sharing between the first memory modules and to provide a predetermined amount of power to each of the memory modules.

5 Claims, 1 Drawing Sheet

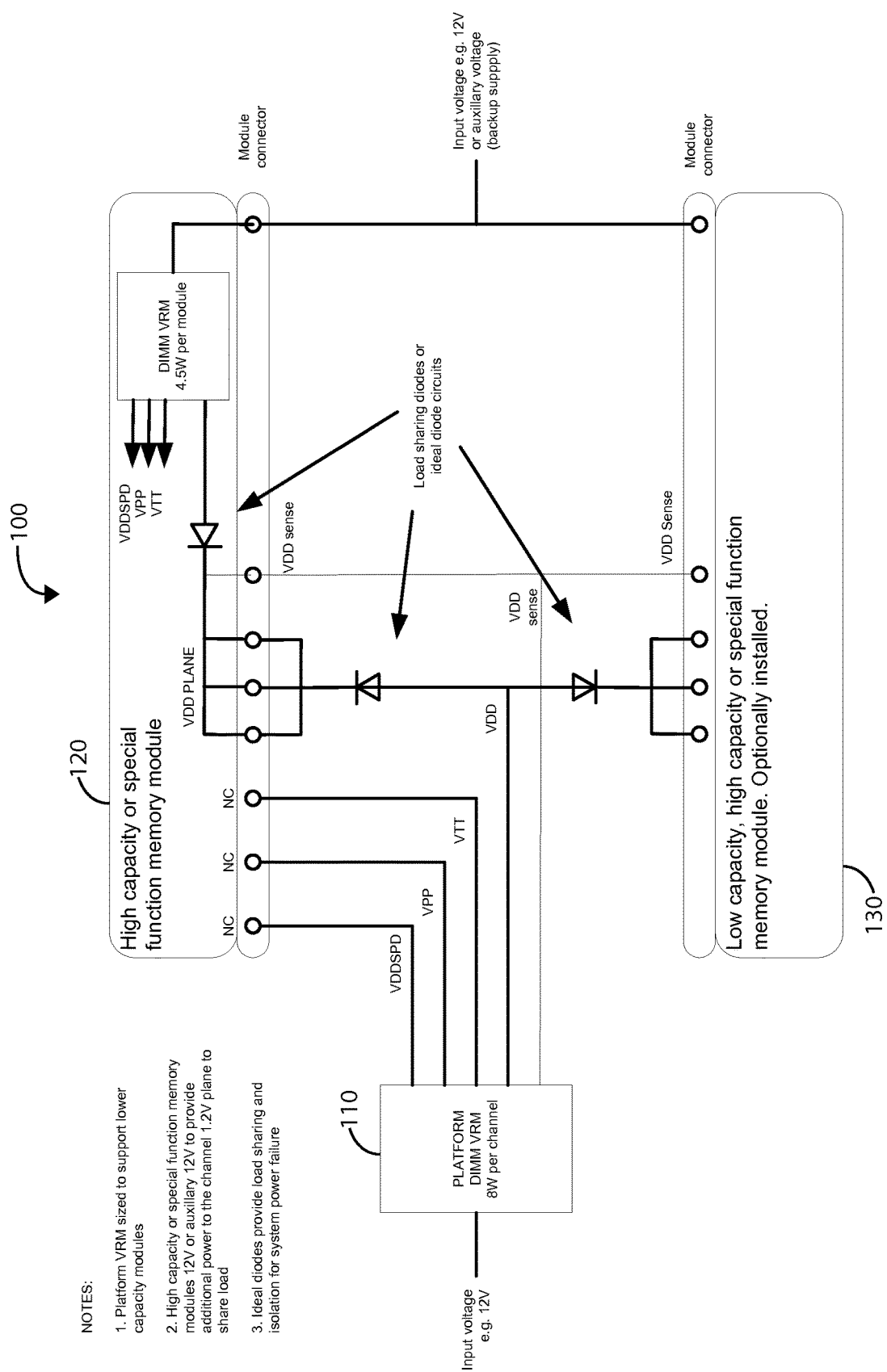

METHOD AND SYSTEM USING MEMORY CHANNEL LOAD SHARING

CROSS-REFERENCES TO RELATED APPLICATIONS

N/A

BACKGROUND OF THE INVENTION

The present invention relates generally to memory systems, and more particularly to computer systems which include memories systems with auxiliary interfaces.

Traditional computer systems, such as servers, workstations, desktops and laptops, all use pluggable memory, which can be inserted into slots on the computer's motherboard as needed. The most common form of pluggable memory is the Dual In-line Memory Module (DIMM). Historically, DIMMs contain multiple RAM chips, typically DRAM, each of which has a data bus width of 4 or 8 bits. Typically, eight or nine 8-bit DRAM chips are arranged in parallel to provide each DIMM with a total data bus width of 64 or 72 bits. The data bus, typically referred to as the 'DQ' bus, is connected to a host controller.

Contemporary computers use one or more VRM(s) (Voltage Regulator Module) to support the memory that can be inserted to the platform. Each VRM uses a higher input voltage, typically 12V, which can be poorly regulated and electrically noisy and produces several lower voltages as needed for the memory technology that the individual platform can support.

The memory channels and sockets are partitioned across the VRMs to meet the platform and memory capacity requirements, so there is a pre-set limit on the available power. This limits the adoption of potentially even higher capacity memory modules or memory modules that provide extra or differing functionality that may require more power than simple memory modules, such as non-volatile memories or modules that support a second voltage source for saving memory data under power failure conditions.

A logical solution would be for each memory module have the capability to supply its own voltage requirements by having a direct connection to the higher input voltage. This consequently would require that every memory module that can be inserted into the platform have its own VRM. Simple economics makes this an unrealistic solution as low capacity memory modules have an increased cost burden compared to higher capacity memory modules.

In light of the above, improvements to memory systems methods of are highly desired.

BRIEF SUMMARY OF THE INVENTION

The present invention relates generally to memory systems, and more particularly to computer systems which include memories systems with auxiliary interfaces. More particularly, the present invention provides a memory load sharing computer system and method therefor.

Modern computer systems demand lower power from the memory and memory systems, which are inherently needed to process data in all of the various computer applications. However, in order to achieve lower power memory components in computer systems, these components must have lower operating voltage. Platform designers face significant challenges with maintaining the memory interface voltage within tolerance particularly because the platform has to support the worst case dynamic power under maximum performance situations and still be able to keep the voltage tolerance under completely idle conditions for "sleep" conditions with very low power.

In an embodiment, the present invention provides a memory load sharing system. This system can include a platform VRM (Voltage Regulator Module) coupled to a memory channel with the platform VRM having a platform voltage input. One or more first memory modules can coupled to the platform VRM through the memory channel. Each of the one or more first memory modules includes one or more plane connectors and a module connector. Each of the one or more first memory modules can also include a memory module VRM coupled to a module load sharing diode that is coupled to the one or more plane connectors of that first memory module.

The platform VRM is coupled to a first platform load sharing diode that is coupled the one or more plane connectors of each of the one or more first memory modules. This platform is configured to support load sharing between the one or more first memory modules and to provide a predetermined amount of power to each of the one or more first memory modules.

In an embodiment, the one or more first memory modules includes one or more high capacity or special function memory modules, or the like. The memory module VRM of each of the one or more first memory modules is configured to source power to the platform VRM to support load sharing between the one or more first memory modules.

In a specific embodiment, the system further includes one or more second memory modules. Each of the one or more first memory modules can include one or more plane connectors and a module connector. The one or more first memory modules are coupled to the one or more second memory modules via the module connectors of the first and second memory modules. Additionally, the platform VRM is coupled to a second platform load sharing diode that is coupled the one or more plane connectors of each of the one or more second memory modules. These one or more second memory modules can include low capacity, high capacity, or special function memory modules, or the like.

The platform VRM can also be configured to support load sharing between the one or more first memory modules and the one or more second memory modules and to provide a predetermined amount of power to each of the one or more second memory modules. In this way, load sharing can be conducted between high capacity memory modules and low capacity memory modules in a single integrated system.

Many benefits are recognized through various embodiments of the present invention. Such benefits include having memory systems operate with lower power and providing the flexibility to address wide static and dynamic power deliver while maintaining cost efficiency. This variable power sharing in a memory channel also can be useful during power failure conditions if the input power source persists after power failure. Those of ordinary skill in the art will recognize additional benefits of various embodiments of the present invention.

BRIEF DESCRIPTION OF THE DRAWINGS

FIG. 1 is a simplified block diagram illustrating a memory computer system according to an embodiment of the present invention.

DETAILED DESCRIPTION OF THE INVENTION

The present invention relates to communication systems and integrated circuit (IC) devices. More particularly, the present invention provides a memory load sharing computer system and method therefor.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

Modern computer systems demand lower power from the memory and memory systems, which are inherently needed to process data in all of the various computer applications. However, in order to achieve lower power memory components in computer systems, these components must have lower operating voltages. Platform designers face significant challenges maintaining the memory interface voltage within tolerance particularly because the platform has to support the worst case dynamic power under maximum performance situations and still be able to keep the voltage tolerance under completely idle conditions for "sleep" conditions with very low power.

In order to accommodate the disparate requirements of wide static and dynamic power delivery while maintaining the best costs a novel solution is proposed. Simply, the platform is designed to support load sharing to each memory socket and provides a certain amount of power to the memory sockets. The regulated power requirements of a platform or computing system using this method of dynamic power delivery will be lower than existing memory platforms today and would be calculated based on the capacity provided by low cost memory modules. It is important to note that the lower capacity modules do not provide any power.

Higher capacity modules and those modules with extended functionality have the ability to source power to the load shared platform from a VRM (Voltage Regulator Module) type device or devices located on the memory module. This voltage regulation can also be used for power failure conditions if the input power source persists after main system power failure conditions. As the power load is shared, the memory module voltage regulator only has to support the incremental power requirements over a single lower capacity and/or lower performance memory module. Multiple memory modules, which together provide a higher overall performance, can also load share as a memory module that is running at higher performance with a corresponding higher power requirement can use current provided by another memory module in the same memory channel that by definition is consuming lower power as it performance will be lower due to the fixed available performance of the memory channel being diverted to the higher performance module.

FIG. 1 is a simplified block diagram illustrating a computer system using memory load sharing according to an embodiment of the present invention. As shown, system 100 includes a platform VRM 110 coupled to one or more first memory modules 120 and, optionally, one or more second memory modules 130. The platform VRM 110 can be coupled to the first memory modules 120 by a memory channel through a load sharing diode or ideal diode circuit. This platform VRM 110 receives an input voltage (12V) and can be sized to support lower capacity modules.

In an embodiment, the first memory modules 120 can be high capacity or special function memory modules, each of which includes a memory VRM coupled to a load sharing diode or ideal diode circuit to one or more VDD PLANE connectors. The load sharing diode between the platform VRM and the first memory modules also connects to these VDD plane connects as shown in FIG. 1. These high capacity or special function memory modules (12V) or auxiliary (12V) are configured to provide additional power to the memory channel (for example 1.2V for DDR4 memory devices) plane to share the power load. The ideal diodes provide the load sharing capabilities, as well as isolation for system power failure conditions.

In a specific embodiment, the second memory modules 130 can be low capacity, high capacity, or special function memory modules. The platform VRM 110 can also be coupled to the second memory modules 130 by a memory channel through a load sharing diode or ideal diode circuit. The first memory modules 120 and the second memory modules 130 can also be coupled to an input voltage (e.g. 12V) or an auxiliary voltage (backup supply).

In an embodiment, the present invention provides a memory load sharing system. This system can include a platform VRM (Voltage Regulator Module) coupled to a memory channel with the platform VRM having a platform voltage input. One or more first memory modules can coupled to the platform VRM through the memory channel. Each of the one or more first memory modules includes one or more plane connectors and a module connector. Each of the one or more first memory modules can also include a memory module VRM coupled to a module load sharing diode that is coupled to the one or more plane connectors of that first memory module.

The platform VRM is coupled to a first platform load sharing diode that is coupled the one or more plane connectors of each of the one or more first memory modules. This platform is configured to support load sharing between the one or more first memory modules and to provide a predetermined amount of power to each of the one or more first memory modules.

In an embodiment, the one or more first memory modules includes one or more high capacity or special function memory modules, or the like. The memory module VRM of each of the one or more first memory modules is configured to source power to the platform VRM to support load sharing between the one or more first memory modules.

In a specific embodiment, the system further includes one or more second memory modules. Each of the one or more first memory modules can include one or more plane connectors and a module connector. The one or more first memory modules are coupled to the one or more second memory modules via the module connectors of the first and second memory modules. Additionally, the platform VRM is coupled to a second platform load sharing diode that is coupled the one or more plane connectors of each of the one or more second memory modules. These one or more second memory modules can include low capacity, high capacity, or special function memory modules, or the like.

The platform VRM can also be configured to support load sharing between the one or more first memory modules and the one or more second memory modules and to provide a predetermined amount of power to each of the one or more second memory modules. In this way, load sharing can be conducted between high capacity memory modules and low capacity memory modules in a single integrated system.

Many benefits are recognized through various embodiments of the present invention. Such benefits include having memory systems operate with lower power and providing the flexibility to address wide static and dynamic power deliver while maintaining cost efficiency. This variable power sharing in a memory channel also can be useful during power failure conditions if the input power source persists after power failure. Those of ordinary skill in the art will recognize additional benefits of various embodiments of the present invention.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A memory load sharing system comprising:
    a platform VRM (Voltage Regulator Module) coupled to a memory channel, the platform VRM having a platform voltage input;
    one or more first memory modules coupled to the platform VRM through the memory channel,
        wherein each of the one or more first memory modules has a first power requirement and includes one or more plane connectors and a module connector,
        each of the one or more first memory modules having a memory module VRM coupled to a module load sharing diode that is coupled to the one or more plane connectors of the first memory module; and
        wherein the platform VRM is coupled to a first platform load sharing diode that is coupled between the platform VRM and the one or more first memory modules and that is coupled to the one or more plane connectors of each of the one or more first memory modules; and
    one or more second memory modules coupled to the platform VRM through the memory channel,
        wherein each memory module of the one or more second memory modules has a second power requirement and includes one or more plane connectors and a module connector, where the second power requirement is lower than the first power requirement,
        wherein the one or more second memory modules are coupled to the one or more first memory modules via the module connectors of the first and second memory modules, and
        wherein the platform VRM is coupled to a second platform load sharing diode that is coupled between the platform VRM and the one or more second memory modules and that is coupled to the one or more plane connectors of each of the one or more second memory modules; and
    wherein the platform VRM is configured to support load sharing between the one or more first memory modules and to provide a predetermined amount of power to each of the one or more first memory modules.

2. The system of claim 1 wherein the one or more first memory modules comprises one or more high capacity or special function memory modules.

3. The system of claim 1 wherein the memory module VRM of each of the one or more first memory modules is configured to provide additional power to a plane of the memory channel to support load sharing between the one or more first memory modules.

4. The system of claim 1 wherein the one or more second memory modules comprises low capacity, high capacity, or special function memory modules.

5. The system of claim 1 wherein the platform VRM is configured to support load sharing between the one or more first memory modules and the one or more second memory modules and to provide a predetermined amount of power to each of the one or more second memory modules.

* * * * *